United States Patent [19]

Sprout, Jr.

[11] 4,434,114
[45] Feb. 28, 1984

[54] PRODUCTION OF WRINKLE-FREE PIEZOELECTRIC FILMS BY POLING

[75] Inventor: Oliver S. Sprout, Jr., Glenside, Pa.

[73] Assignee: Pennwalt Corporation, Philadelphia, Pa.

[21] Appl. No.: 345,858

[22] Filed: Feb. 4, 1982

[51] Int. Cl.³ .............................................. H04R 17/00
[52] U.S. Cl. ...................................... 264/22; 264/25; 264/105
[58] Field of Search .................. 264/22, 24, 25, 104, 264/105, 1.4, 2.6; 307/400

[56] References Cited

U.S. PATENT DOCUMENTS

| | | | |
|---|---|---|---|
| 2,649,492 | 8/1953 | Linton et al. | 264/105 |
| 3,571,679 | 3/1971 | Turnhout | 317/262 |
| 3,691,264 | 9/1972 | Asahina | 264/22 |
| 3,794,986 | 2/1974 | Murayama | 307/400 |
| 3,878,274 | 4/1975 | Murayama et al. | 264/24 |
| 3,943,614 | 3/1976 | Yoshikawa et al. | 264/22 |
| 3,967,027 | 6/1976 | Igarashi et al. | 428/212 |
| 4,079,437 | 3/1978 | Sheffield | 361/233 |
| 4,127,681 | 11/1978 | Ferren et al. | 264/22 |
| 4,265,841 | 5/1981 | Fujimori et al. | 264/22 |
| 4,290,983 | 9/1981 | Sasaki et al. | 264/22 |
| 4,302,408 | 11/1981 | Ichihara et al. | 264/22 |
| 4,340,786 | 7/1982 | Tester | 264/22 |

FOREIGN PATENT DOCUMENTS 7409611  1/1975  Netherlands ..................... 264/104

*Primary Examiner*—Jeffery R. Thurlow

[57] ABSTRACT

A single or multi-layer of films containing at least one oriented, piezoelectric-sensitive (PES) film, sandwiched between resilient conductive liners, is subjected to a high dc field strength while the layer is maintained at an elevated temperature to induce piezoelectric properties in the oriented PES films without the films wrinkling.

15 Claims, No Drawings

PRODUCTION OF WRINKLE-FREE PIEZOELECTRIC FILMS BY POLING

BACKGROUND OF THE INVENTION

This invention relates to a process for treating a layer of film, to render piezoelectric-sensitive (PES) film in such layer piezoelectric and wrinkle-free, and more particularly, to a high dc field intensity technique for the production of piezoelectric film which technique minimizes catastrophic breakdown of the film during processing and renders the induced films wrinkle-free.

Films of dielectric materials have been observed to be capable of acquiring a static electric charge upon being poled (i.e., being exposed to a dc field) which static charge is quasi-permanent, the degree of permanency being dependent largely upon the chemical constitution of the film. Such a charge, due largely to trapped positive and negative carriers positioned at or near the two surfaces of the dielectric respectively, produces what is known as an electret. When the opposing surfaces of an electret are not covered by metal electrodes, the structure possesses an electrostatic field and is, in a sense, the electrostatic analogue of the permanent magnet.

In addition to being capable of acquiring a static electric charge (and, as a result acquiring an electrostatic field), a certain limited class of film also acquires an ordered internal molecular orientation when exposed to a dc field so that even when the static (or electret characterizing) charges are dissipated, the film thereafter possesses the property of being able to generate an electric current between the electrically connected opposed surfaces by changing the pressure imposed on the opposed surfaces. This property is known as the piezoelectric effect and for some such film (e.g., film made from polyvinylidene fluoride (PVDF)) also possesses a pyroelectric effect (i.e., the property of producing electron flow by changing the temperature of the film). Also, when a voltage is applied to the opposite surfaces of a piezoelectric film, a reverse piezoelectric effect occurs, i.e., the film deforms in proportion to the voltage applied to it.

Unfortunately, the term "electret" has been broadly used in the art to indicate any film that has been poled whether or not there has been molecular orientation; obviously such broad application of the term is misleading. The confusion is compounded by the fact that piezo-and pyroelectric films are capable, during exposure to a dc field, of acquiring static "electret-type" charges along with the internal molecular orientation. The present invention is directed to the production of a wrinkle-free piezoelectric film which may also be pyroelectric.

PROBLEMS IN POLING

Thin Polymeric films having relatively high dielectric constants are particularly useful for the production of piezoelectric films. Unfortunately, thin films, when exposed to a high strength dc field (i.e., at least about 1200 kilovolts per centimeter of film thickness) individually, i.e., using a single layer of film between opposing electrodes, are subject to breakdown in the electrical field. Furthermore, minor film defects, such as thickness variation or the presence of impurities or small holes are more apt in thin as opposed to thick film to promote film breakdown under the conditions of high temperature and high voltage. When breakdown of the film occurs, the electrical field cannot be maintained because a short circuit results across the electrodes. The problem is particularly acute in the poling of film formed from PVDF, a type of film particularly susceptible to acquiring the piezoelectric effect, because this film decomposes to produce hydrofluoric acid which tends to further deteriorate the film by chemical action and to produce a residue of conductive carbon which creates a path for short circuiting. Furthermore, because severe field conditions generally are required for production of piezoelectric film, the film-breakdown problem occasioned during poling is particularly troublesome in producing piezoelectric film.

Another problem which is particularly acute in the poling of film formed from PVDF is wrinkling. Wrinkles in the film typically appearing as stretch lines, corrugations or pock marks are undesirable because they may adversely effect the subsequent fabrication and performance of the elements as well as their aesthetic appeal. Wrinkling is related to such factors as the orientation and shrinkage characteristics of the film, the type of film and the array to be poled, and the strains inherently produced in piezoelectric materials by the applied poling voltage.

STATEMENT OF THE INVENTION

The present invention provides a process for producing wrinkle-free piezoelectric film from oriented PES film. By piezoelectric-sensitive film ("PES film") is meant a film that is capable of acquiring a piezoelectric activity of at least 5 pico-Coulombs per Newton (pC/N) when subjected to a high strength dc field. The process comprises applying to a single or multi-layer of film, at least one of which is an oriented PES film, sandwiched intimately between resilient conductive liners, at a temperature between room temperature and a temperature just below the melting point of the film, a high strength dc field, the single or multi-layer with liners being disposed between a single set of oppositely charged electrodes with the liners in contact with the electrodes, and maintaining the field until piezoelectric activity is induced in at least one of the oriented PES films, and thereafter cooling the single or multi-layer to below about 50° C. before or after removing the dc field, removing the dc field and thereafter grounding the PES film to remove surface charge.

The multi-layer array of this invention is composed of at least two layers of film whose surfaces are in abutting relationship. Preferably each film in the array should be of the same size, with the edges of each film being in alignment with one another. If the layers in the array are different sizes, however, it is essential that at least a portion of the layers overlap and that the overlapping portions occupy the area between the electrodes even though their borders are not aligned. It is desirable to have the film cut into layers larger than the electrodes in order to prevent edge arcing (i.e., an electrical discharge that runs along the edge of the film and jumps across the film at the edge to the other electrode).

DESCRIPTION OF THE PREFERRED EMBODIMENT

PES films to which the process of the present invention is applicable are those formed from high molecular weight vinylidene fluoride polymers, vinylfluoride polymers, vinylchloride polymers and polyamides. Such polymers may be homopolymers, copolymers, or terpolymers, as well as polymer mixtures or blends. Preferred polymers are those containing at least a major mole proportion of vinylidene fluoride including, for example, vinylidene fluoride homopolymers, and copolymers or terpolymers containing at least 65 mole percent of vinylidene fluoride and at least one other copolymerizable monomer such as trifluoroethylene, tetrafluoroethylene or vinyl fluoride. Particularly good results are obtained using vinylidene fluoride homopolymer or a copolymer of vinylidene fluoride and tetrafluoroethylene.

The PES films, used in the present process, must be monoaxially oriented or multiaxially oriented; the orientation of this film can be carried out by conventional means such as blowing, stretching, rolling, or any combination of these techniques. The problem of wrinkling during poling is not a problem in unoriented film. Hence, this invention does not intend to cover unoriented PES film. The process of annealing of oriented film removes some of the orientation of the film and thus wrinkling is less pronounced when the film is exposed to a dc field. Hence, annealing prevents severe wrinkling of oriented film.

While the process of the present invention is applicable to the treatment of PES film of any thickness, it is particularly applicable when treating thin PES film, i.e., such film having a thickness below about 150 micrometers ($\mu$m), because the piezoelectric property is imposed more readily upon a thin film. When exposing film in an array to a dc field, as required by the process of the present invention, each film may be of the same or a different thickness.

Only one layer in a multi-layer array must be an oriented PES film; the other layers may or may not be the same as the oriented PES film. Examples of other films that may be used in the multi-layer are polyethylene terephthalate, polypropylene, tetrafluoroethylene, polyvinyl chloride, and the like. The thickness of the non-PES layers in an array may be the same as for the oriented PES film, i.e., from thin film to a reasonably thick film.

Metallizing the surfaces of film that contact the resilient conductive liners to provide the film with a conductive coating ensures excellent contact and distributes the dc field uniformly over the surfaces of the film being exposed to the dc field although metallized films are also subject to wrinkling. Such metallizing also aids the rapid grounding of the single or multi-layer to remove the surface charge after exposure to the dc field. Suitable conductive coatings may be formed, for example, by vapor deposition, painting, electroplating, sputtering, laminating and the like (called metallizing) of various conductive materials including, for example, metals or metallic oxides, as are well known in the art.

While other film surfaces within the array may also have a conductive coating imposed thereon (provided there are at least two adjacent layers without any such conductive coating on their abutting surfaces), the use of such coatings is not a preferred embodiment since it defeats the purpose of the present invention. Such a metallized coating promotes electrical breakdown. A coating on the surface of the second film in a three-layer array which surface abuts the third layer of said array would, for example, effectively serve to reduce the three-layer array to a two-layer array.

The optimum elevated temperature at which the multi-layer of films is maintained during exposure to the dc field will vary depending on the nature of the resins. Generally any temperature from about room temperature (i.e., about 20° C.) to just below the melting point of the film, is useful. Best results are obtained at a temperature near, but below the melting point of the film which generally is between about 50° and about 120° C. Usually a temperature between the range of about 80° and about 110° C. is preferred.

Materials found to abate wrinkling are resilient conductive sheets which may resist or absorb stresses, tending to equalize and negate any wrinkle-causing vectors. Stiff sheets are not effective as liners since they cannot intimately contact the film as resilient elastomers can; metallic foils, although helpful as a filling substance, also do not possess desirable resilience for intimacy. An example of a suitable liner for positioning between the electrodes and outer surfaces of the single or multi-layer is a carbon-containing silicone rubber sheet. The composition of the liner however, is not primarily important and it is conceived that other elastomers or polymeric substances in sheet, foam, or laminated form will be useful if other properties such as resilience and conductivity are appropriate.

The size of the film area which can be poled will be limited by practical considerations restricting the indefinite enlargement of metallic plate electrodes when being used. Long lengths of film as a single or multi-layer can be poled by rolling the film on a core if flexible electrodes are positioned on either side of the film and rolled concurrently with the film. Aluminum foil has been employed in the manner described but is less flexible and less amenable to rolling than the film, so that incomplete contact and buckling may occur. The conductive rubber mentioned previously has proved to be well suited for rolled poling without wrinkling and, in fact, has made this method feasible, especially when compared to aluminum foil.

Although the rolled poling method accomplishes scaled-up production, it is a batch operation and still further increases in production rates will become possible through a continuous poling operation. An example of a continuous procedure comprises the passage of a moving single or multi-layer of film around and in contact with a rotating drum, which serves as one of a pair of poling electrodes when the drum surface is conductive. A flexible electrode in contact with the face of the film opposite to the drum would complete the poling circuit. Again, conductive rubber has been found more effective than aluminum foil in an evaluation of drum poling and is a requisite for this mode of poling. Conductive rubber may also be used to cover the drum.

In one embodiment of the process of the present invention the single or multi-layer array of oriented PES film is placed between and in intimate contact with conductive resilient rubber liners and is then placed between and in contact with a pair of electrodes. This is then placed in a hot oven, and a direct current voltage field is applied across the electrodes to expose the array at a field strength intensity of from at least about 50 kilovolts to about 1500 kilovolts per centimeter (kv/cm); the preferred field intensity range across the desired film being exposed is from about 200 to about 1500 kv/cm; usually from about 300 to about 1000 kv/cm is used.

While exposing to the dc field for about one hour is usually sufficient to induce piezoelectric activity in the PES film of the array, periods within the range of about 30 minutes to about 24 hours may be used as desired depending on the chemical and physical properties of the various films and other exposure to the dc field conditions, (e.g., the higher the dc field intensity, the shorter the needed exposure time). In raising the voltage of the dc field to the desired high level of intensity, it is preferred to increase the voltage gradually until the desired field strength intensity is reached. The exposed oriented PES films have a piezoelectric activity of at least 5 pC/N, and preferably of at least 10 pC/N.

EXAMPLES

The following examples will serve to further illustrate this invention.

Unless otherwise indicated, the standard exposing to dc field intensity procedure used in the examples was as follows:

A multi-layer (i.e., three layers) of oriented PES film samples was placed between and in contact with two brass electrode discs (0.6 cm thick by 7.6 cm square, each weighing about 305 g.); for some of the exposings, an electrode liner of conductive rubber (0.32 cm thick by 7.6 cm square and weighing about 21.7 g) was inserted between each electrode and the multi-layer array; in a few exposings, a 875 g weight was placed on top of the assemblage of electrodes, resilient conductive rubber liners and multi-layer; the entire assembly was then placed in a circulating hot air oven (80° to 110° C.) for about 5 to about 15 minutes to warm up before electrical power was applied; a direct current (dc) field was then applied across the electrodes stepwise in increments of about 100 kv/cm with about one minute intervals between increments up to 500 kv/cm of film array thickness. This application of dc field intensity (at 500 kv/cm) was continued for about one hour. While the dc field intensity was maintained, the heat in the oven was turned off and the multi-layer was cooled to below about 50° C.

The piezoelectric strain coefficient ($d_{33}$) measurements were made by inserting a poled PES film sample between removable aluminum foil (25 μm thick) electrodes in contact with 0.6 cm brass electrodes of the same diameter. This assembly was put into a Carver press in such a way as to be insulated from the press platens. The homocharge was removed by short circuiting the film surfaces under pressure overnight. The $d_{33}$ constant values were obtained by applying a pressure of 3600 kilograms (115 Kg/cm$^2$) to the specimen and recording the piezoelectric charge developed using a highly sensitive electrometer. The piezoelectric strain coefficient is then obtained by dividing the developed charge per square centimeter by the imposed stress and the values are recorded in pico-Coulombs per Newton (pC/N).

In the examples, the film in the A position is the layer of film in the multi-layer array that is in contact with and adjacent to the resilient conductive liner (when used) abutting the positive electrode. The film in the B position is the layer of film in the array that is in contact with and adjacent to the film in the A position. Additional layers of film in the array, if any, are similarly indicated as being in the C, D, E, etc. positions.

EXAMPLE 1

Uniaxially (film I) and biaxially (film II) oriented PVDF films which had been annealed constituted the multi-layer of film in this example. The standard exposure to dc field procedure was used.

Annealing was accomplished by heating lengths of film at 110° C. (slightly above the projected exposure temperature of 100°) for about 16 hours. One section of film was annealed flat, in a relaxed condition, and shrunk 13% of its original length in the stretch (machine) direction. A second section of film was rolled firmly around a rod with ends taped fast prior to annealing; it shrunk only 4% in the stretch direction. In either case, shrinkage in the transverse direction during annealing was less than one percent. This annealing process of the film was performed so that any latent shrinkage traceable to the prior stretching operation (i.e., orientation) would be eliminated as a source of wrinkling during the exposing to dc field intensity. Annealing to pre-shrink the film prior to exposing involved a risk of impairment of piezoelectric activity, since higher activity is usually acquired by more extensively stretched film.

The following Table 1 shows the exposure conditions and observations for film treated in accordance with this example.

TABLE 1

| | | Poling Mode | | | | | Array | Poled Array | |
|---|---|---|---|---|---|---|---|---|---|
| | | Electrode | Top | Array | | | Total | | Activity |
| No. | Annealing | Liner | Weight | A | B | C | Mils | Wrinkling | $d_{33}$pC/N |
| 1.1 | R* | None | None | I | I | I**** | 2.9 | Heavy | 9.0 |
| .2 | T** | " | " | I | I | I | 2.6 | " | 10.1 |
| .3 | R | C.R.*** | Present | I | I | I | 2.8 | Slight | 10.1 |
| .4 | T | " | " | I | I | I | 2.6 | Very slight | 10.1 |
| .5 | R | None | " | I | I | I | 2.8 | Heavy | 4.5 |
| .6 | T | " | " | I | I | I | 2.6 | " | 6.7 |
| .7 | R | C.R. | None | I | I | I | 2.7 | None | 10.4 |
| .8 | T | " | " | I | I | I | 2.4 | " | 11.0 |
| .9 | R | " | " | I | II | II***** | 2.6 | " | 13.5 |
| .10 | T | " | " | I | II | II | 2.4 | " | 12.6 |

*R = Relaxed
**T = Tensioned
***C.R. = Conductive Rubber
****Film I. Uniaxial PVDF, ~ .8 mil thick
*****Film II. Biaxial PVDF, .9 mil thick TABLE 1 shows that exposing multi-layer stacks of annealed films directly between brass electrodes resulted in heavy wrinkling of the films regardless of whether they had been annealed while under tension or relaxed (Nos. 1 and 2). Thus, the annealing did not prevent wrinkling; furthermore, the annealing impaired good contact between the films and electrodes because it resulted in the unevenness of the film surfaces. To promote good contact, resilient conductive rubber liners (carbon in silicone rubber) were inserted between each electrode and the film array to fill irregularities between the film surfaces and electrodes; the top weight was added then to this assembly prior to exposing in order to compress these three strata together. The resulting induced films were only slightly wrinkled (Nos. 3 and 4). The top weight did not significantly reduce wrinkling because when the top weight was used without the conductive rubber, heavy wrinkling again occurred (Nos. 5 and 6). Using the resilient conductive rubber liners alone were sufficient to produce unwrinkled films (Nos. 7 and 8). The same result was found when the underfilms in the array were biaxially oriented rather than uniaxially oriented (Nos. 9 and 10). The piezoelectric activity values of the arrays using the conductive liners were equal or superior to the values of the arrays exposed without conductive rubber.

EXAMPLE 2

Films I and II of Example 1 were subjected to the standard exposure to dc field procedure in this example. The films, however, were not annealed prior to exposing to the dc field. A second uniaxial PVDF film (film Ia) was also used which was lesser in quality than film I, since it contained wrinkles and roll marks to a pronounced degree as a consequence of the prior stretching operation (i.e. orientation). In one of the runs using film Ia, a 7.6 cm square of aluminum foil about 0.5 mil thick was inserted between the brass electrodes and film array as a comparison to conductive rubber. The resilient conductive rubber liner used in this example was carbon loaded silicone rubber.

The results are set forth in the following TABLE 2.

TABLE 2

| | Poling Mode | | | | | Array Total | Poled Array | |
|---|---|---|---|---|---|---|---|---|
| No. | Electrode Liner | Top Weight | Array** A | B | C | Mils | Wrinkling | $d_{33}$ pC/N |
| 2.1 | None | None | I | I | I | 2.5 | Heavy | 9.5 |
| .2 | " | Present | I | I | I | 2.4 | " | 9.3 |
| .3 | C.R. | None | I | I | I | 2.4 | None | 14.3 |
| .4 | " | " | I | II | II | 2.4 | " | 13.5 |
| .5 | None | " | Ia | Ia | Ia | 2.9 | Heavy | 6.5 |
| .6 | " | " | Ia | II | II | 2.3 | " | 9.6 |
| .7 | AL* | " | Ia | Ia | Ia | 2.9 | " | 4.5 |
| .8 | C.R. | " | Ia | Ia | Ia | 2.9 | Mild | 11.8 |

**Film I Uniaxial PVDF, ~ .8 mil thick
Film Ia Uniaxial PVDF, ~ .9 mil thick Contained wrinkles & roll marks
Film II Biaxial PVDF, ~ .7-.8 mil thick
*AL = Aluminum foil ~ .5 mil thick The results reported in TABLE 2 show that the unannealed film became wrinkled, just as the annealed films of Example 1, when exposed, not only in contact with the brass electrodes, but when the top weight was added to promote contact between the films and electrodes (Nos. 1 and 2). However, when the conductive rubber liner was inserted between the electrodes and film array, the induced array produced unwrinkled films regardless of whether the array was composed of all uniaxial films (I) or one uniaxial next to two biaxial films (Nos. 3 and 4). The uniaxial film (Ia) became more wrinkled when exposed between brass electrodes in arrays of either three uniaxial (Ia) layers or one uniaxial next to two biaxial films (Nos. 5 and 6). Even when the aluminum foil was inserted between the electrodes and array of three uniaxial layers (Ia) the film wrinkled (No. 7). Marked wrinkling was avoided in the homogeneous array of film Ia only when the conductive rubber liners were used between the electrodes and array (No. 8). The mild wrinkling in this film was attributed to its original irregularities which were almost completely removed by this exposing procedure. The piezoelectric activity values of the arrays using the resilient conductive rubber liners were significantly higher than the values of the remaining arrays because of the better electrical contact.

EXAMPLE 3

Films I and II of Example 1 and a thinner uniaxial film (III) were exposed to dc field intensity using the standard procedure in three-layer arrays of one uniaxial film next to two biaxial films.

The effect of using different conductive elastomers was investigated in these experiments. The conductive elastomers were as follows:

a. Nickel particles in silicone rubber in the form of a semi-flexible sheet about 5 mils thick.

b. Carbon in silicone rubber in the form of a flexible, resilient and mildly elastic sheet about 34 mil thick.

The results are set forth in the following TABLE 3.

TABLE 3

| | Array* | | | Array Total | | Wrinkling | Activity $d_{33}$ pC/N | | | | |
|---|---|---|---|---|---|---|---|---|---|---|---|
| No. | A | B | C | Mils | Film | Degree | Uniax A | Biaxial B | C | Total Array | Note |
| | | | | | | Nickel/Silicone Rubber | | | | | |
| 3.1 | III | II | II | 2.1 | A | Mild Par. MD | | Unstable | | | ① |
| | | | | | B,C | V. Heavy Per. MD | | | | | |
| .2 | I | II | II | 2.1 | A | Slight Par. MD | 5.0 | −7.8 | | 7.2 | ② |
| | | | | | B,C | Mild Per. MD | | | | | |
| | | | | | | Carbon/Silicone Rubber | | | | | |
| .3 | III | II | II | 2.4 | A | Trace Par. MD | 29.9 | 21.3 | 5.0 | 19.2 | |
| | | | | | B,C | Slight Per. MD | | | | | |
| .4 | I | II | II | 2.7 | A | None | 21.4 | 7.8 | 2.1 | 13.5 | |
| | | | | | B,C | Trace | | | | | |

*Film III Uniaxial PVDF .6-.7 mil thick, stretched 6 × machine direction (MD)
Film I Uniaxial PVDF .8-.9 mil thick, stretched 4.5 × MD
Film II Biaxial PVDF .6-.9 mil thick, stretched 3.6 × MD, 3.1 × transverse direction (TD)
Per. = perpendicular; Par. = parallel
① Liner 5.1 mil ave at positive electrode
Liner 4.6 mil ave at negative electrode
② Reverse Liner positions TABLE 3 shows that the induced films using the semi-flexible nickel/silicone rubber liners between the brass electrodes and multi-layer array had limited wrinkling in the A film but that the piezoelectric activity of the array was negligible (Nos. 1 and 2). With the carbon/silicone rubber liners, wrinkling on the A film was insignificant and the activity of the film arrays was quite favorable (Nos. 3 and 4). This demonstrates that a semi-flexible nickel/silicone rubber liner is not suitable for use in the instant invention.

EXAMPLE 4

Uniaxial PVDF about 2 mils (50 μm) thick was exposed to dc field intensity in an array positioned next to two layers of poly(vinyl chloride)(PVC), each about 15 μm thick, using the standard exposure procedure with the exception that the array was cooled only for 10 minutes to a temperature of less than 80° C. under the applied field intensity. The brass electrodes were 0.64 cm thick with face dimensions of 11.43 cm by 21.59 cm, each weighing 1,258±5 g. The aluminum foil and resilient conductive liners were also 11.43 cm by 21.59 cm, but all films had dimensions of 13.97 cm by 24.13 cm to provide an insulating margin around the films for prevention of edge arcing. In determining the piezoelectric activity of these larger films, activities were measured at three sites approximately equidistant over the length of the film in a line running diagonally between opposite corners of the film.

The following TABLE 4 shows the conditions and observations for films treated in accordance with this example.

TABLE 4

| No. | Electrode Liner | Array Total μm | FILM | Wrinkling | Shrinkage % MD | Shrinkage % TD | Activity $d_{33}$ pC/N Test Site I | Activity $d_{33}$ pC/N Test Site II | Activity $d_{33}$ pC/N Test Site III | Note |
|---|---|---|---|---|---|---|---|---|---|---|
| 4.1 | None | 83 | A | Moderate | 5.2 | 0 | 6.4 | 6.4 | 6.1 | |
| | | | B | Mild | 6.6 | 6.8 | | −1.4 | | |
| | | | C | " | 6.6 | 5.6 | | 0.4 | | |
| .2 | AL | 79 | A | Heavy | 3.9 | 0 | 8.7 | 9.9 | 9.6 | AL |
| | | | B | Moderate | 6.6 | 4.5 | | 4.4 | | constricts |
| | | | C | " | 6.6 | 4.5 | | 4.6 | | 2.9% |
| .3 | C.R. | 80 | A | None | 3.9 | 0 | 11.6 | 12.4 | 12.2 | |
| | | | B | " | 6.6 | 4.5 | | 4.6 | | |
| | | | C | " | 5.9 | 4.5 | | 3.3 | | |
| .4 | AL | 80 | A | Moderate | 3.9 | 0 | 10.3 | 10.0 | 10.0 | AL |
| | | | B | " | 6.6 | 4.5 | | 2.9 | | constricts |
| | | | C | Light | 6.6 | 6.8 | | 3.1 | | 2.2% ① |
| .5 | C.R. | 80 | A | Mild | 2.6 | 0 | 9.6 | 9.8 | 8.9 | ① |
| | | | B | Slight | 5.2 | 4.5 | | −0.9 | | |
| | | | C | Trace | 5.2 | 4.5 | | 5.1 | | |

Film A = Uniaxial PVDF 52 μm thick, stretched 5.3 × MD
Film B & C = PVC ~ 15 μm Blow molded
C.R. = Conductive rubber 34 mil
① Assembly compressed by C-clamps TABLE 4 shows that moderate wrinkling occurred when no liner was used, heavy wrinkling when aluminum foil was used, and no wrinkling when the conductive rubber liner was used (Nos. 1, 2 and 3). The foil constricted during exposure, that is, it seemed to shrink in length; this was due to wrinkling of the films which had formed perpendicularly to the film's length. The films also contracted along their long dimension, i.e., their stretch or machine direction. It appeared that the foil had been compressed lengthwise by the shrinkage of the film to form rigid, immovable wrinkles in the foil. These ridges prevented any other movement of the films so that wrinkles were immobilized or "set" in the films. When the exposure assembly was compressed by C-clamps (Nos. 4 and 5), wrinkling occurred during exposure regardless of whether aluminum foil or conductive rubber liners were used. The aluminum foil constricted as before. The compression of the conductive rubber evidently prevented its response to movement in the films, so that the rubber functioned in a manner similar to the aluminum foil. Although compression improved packing of voids and enhanced contact between electrodes, liners, and films, good contact was not sufficient to eliminate wrinkling but rather it facilitated wrinkling in the case of conductive rubber.

EXAMPLE 5

This experiment demonstrates that small areas in a multi array can be selectively exposed to a dc field intensity. This would permit simultaneous production of a considerable number of small piezoelectric elements in a single exposure of a sizable piece of film. Or, only chosen areas within a larger film section could be exposed if required by certain applications.

A uniaxial PVDF film about 0.6 mils thick was exposed next to two layers of biaxial PVDF films each about 0.8 mils thick using the standard procedure. Each layer of film in the array was cut into 12.7 cm square. Brass electrodes were used having the dimensions of 0.64 cm thick with 11.43 cm square faces.

The resilient conductive rubber liner used was a 34 mil thick carbon in silicone rubber. Small patches or pads of the resilient conductive rubber liner served to define the areas to be exposed and were either circles having a diameter of 6.35 cm or rectangles 1.27 cm by 4.45 cm. The small pads were located on only one side of the film array, adjacent to either the anode or cathode in different experiments. A 11.43 cm square conductive rubber electrode liner was located on the opposite side of the array, or omitted in one experiment.

The following TABLE 5 shows the conditions and observations for films treated in accordance with this example.

TABLE 5

| No. | Adjacent Electrode Pads | Adjacent Electrode Liner | Array Total Mils | Wrinkling & Shrinkage All, at PAD | Wrinkling & Shrinkage Overall Uniax* | Wrinkling & Shrinkage Overall Biax** | $d_{33}$ pC/N PAD | $d_{33}$ pC/N Film A | $d_{33}$ pC/N Total Array |
|---|---|---|---|---|---|---|---|---|---|
| 5.1 | ⊕ | None | 2.1 | Smooth | Moderate Par.ᵃ MD 7% MD | Heavy Per.ᵇ MD 0% MD | 1c 2d 3d | 21.1 | 10.1 8.1 2.2 |

TABLE 5-continued

| | Adjacent Electrode | | Array Total | Wrinkling & Shrinkage | | | d33 pC/N | | |
|---|---|---|---|---|---|---|---|---|---|
| | | | | All, at | Overall | | | Film | Total |
| No. | Pads | Liner | Mils | PAD | Uniax* | Biax** | PAD | A | Array |
| .2 | ⊕ | ⊖ | 2.3 | Smooth | 0% TD Mild Par. MD 7% MD 0% TD | 0% TD " " " | 4d 1 2 3 | 20.2 10.9 17.7 | 10.1 6.2 6.2 7.3 |
| .3 | ⊖ | ⊕ | 2.2 | Smooth | Slight Par. MD | " | 1 2 3 | 21.9 18.5 18.5 | 9.5 3.6 4.8 |
| .4 | None | ⊕ & ⊖ | 2.3 | Not applicable | None 2% MD | " | N.A. | 20.2 | 5.6 |
| .5 | None | None | 2.2 | Not applicable | Mild Par. MD 5% MD 0% TD | " | N.A. | 6.7 | 1.3 |

*Uniaxial PVDF ~ .6 mil thick, stretched 6 × MD
**Biaxial PVDF .8 mil thick
Par. a = Parallel
Per. b = Perpendicular
c. Pad 1 is a circle with 6.34 cm diameter
d. Pads 2, 3, and 4 are rectangles, 1.27 cm by 4.45 cm.

TABLE 5 shows that the film areas adjacent to the pads were effectively exposed to dc field intensity, the uniaxial PVDF film, the closest film to the positive electrode, acquiring an important degree of piezoelectric activity. The films were smooth in the pad areas (Nos. 1 to 3). These results were equal to those achieved by use of the 11.43 cm square liner (No. 4). Exposing the multi-layer array in direct contact with the brass electrodes resulted in low activity and wrinkling of the uniaxial film (No. 5). Wrinkling also occurred in all of the films where the films were not confined by the pads. This may have been because a vertical gap existed between a film surface and the electrode in the pad free areas.

EXAMPLE 6

This experiment is to demonstrate a roll poling technique for the exposing of a continuous length of film. A array of three films of one uniaxial PVDF positioned next to two layers of biaxial PVDF was sandwiched between two layers of conductive rubber liners and rolled around a core. The core was made of tetrafluoroethylene polymer (PTFE), DuPont's TEFLON ®. One of the rubber layers was an anode, the other, the cathode, and each was connected to a power source by contact with a copper clamp which also served to hold the roll tightly on the core. Since rolling would bring oppositely charged rubber electrodes in contact with each other, it was necessary to separate them by an insulating film. Each copper clamp contacted only one rubber electrode since the opposite face of the clamp was isolated by either the stack of films to be poled or the insulating film. The insulating film was chlorotrifluoroethylene polymer (PCTFE), Minnesota Mining and Manufacturing Company's KEL F ®. The conductive rubber was the 35 mil liner of carbon filled silicone rubber.

If the electrodes in this exposure technique were not separated by sufficient distance or were not insulated by means such as the projecting array of films, electrical arcing could occur. Hence, in this experiment, different ways were used to prevent this edge arcing; the procedures were as follows:

a. Each conductive rubber electrode was 4"×10" in size and was surrounded by a frame of a 35 mil thick ordinary gum rubber sheeting which was non-conductive. This was 8"×12" overall with a 4"×10" opening in the center, corresponding to the conductive rubber. The array of films was thus supported uniformly. This prevented the sagging, wrinkling and electrical breakdown of the film at the edges of the 4"×10" electrode which had been experienced otherwise. The seam between the gum and conductive rubbers was covered with electrical insulating tape on the face next to the film to avoid electrical edge effects and breakdown. The ends of the films and electrodes remaining after rolling did not match evenly because of a spiraling effect during winding. To prevent edge arcing, a piece of the PCTFE film about 3.25"×5.75" was positioned at the finishing end of the roll between the array and outer (positive) electrode, extending about 1" over the array.

b. Here, the conductive rubber was 6"×12", the same size as the films to support them evenly. A mask or frame of PCTFE, 7"×13", with a 4"×10" opening in the center, was inserted between the array and conductive rubber. The PCTFE film thus extended beyond the electrodes and films on all sides, preventing edge arcing, but exposing a central poling area. The copper clamps were insulated with electrical tape for a distance of 3.5" from each end to prevent possible edge arcing between the clamps and conductive rubber electrodes.

TABLE 6

| | Array Total | | | d33 pC/N Film | | |
|---|---|---|---|---|---|---|
| No. | μm | Method | Wrinkling | A | B | C |
| 6.1 | 63 | (a) | Smooth Sl. wrinkling 1"-2" from ends; crease under clamp | 20.7 | 10.4 | 3.4 |
| .2 | 65 | (b) | Smooth Sl. wrinkling about under clamp | 17.3 | 8.6 | 0.9 |

Uniaxial PVDF, ~ 21μ thick, stretched 4.5 × MD
Biaxial PVDF ~ 22μ thick

Table 6 shows that uniaxial film acquired good piezoelectric activity and did not become wrinkled as a result of exposing. Slight wrinkling did occur, however, at the ends of the films or in a location under a clamp. In either position, the minor wrinkling observed evidently resulted from compression by either or both of the clamps, which seemed to have been tightened excessively; this is a correctable condition by loosening the clamps somewhat.

length of film and arranged in two rows of three sites each. The activity of the PVC films was low and their shrinkage and wrinkling characteristics were close to those of the PVDF film, so data on the PVC films was omitted.

TABLE 7

| No. | C.R. on Drum | Cathode | Total μm | Wrinkling | % Shrinkage MD | % Shrinkage TD | Activity d33 pC/N Test Site I | II | III | IV | V | VI |
|---|---|---|---|---|---|---|---|---|---|---|---|---|
| 7.1 | No | C.R. | 58 | Mild | 4.2 | 0 | 8.8 | 17.4 | 22.3 | 5.0 | 18.0 | 17.4 |
| .2 | No | Al[1] | 57 | Mild | 2.1 | 0 | 3.0 | 9.7 | 4.8 | 8.9 | 9.0 | 8.8 |
| .3 | Yes | C.R. | 59 | None 14"L | 5.2 | 0 | 9.6 | 11.1 | 16.5 | 9.2 | 8.0 | 8.9 |

Uniaxial PVDF ~ 26 μm thick, stretched 5 × MD 7" × 20"
PVC ~ 15 μm thick, Blow molded
C.R. = Conductive rubber 34 mil - 6" × 16"
Conductive rubber 34 mil on drum 6" × 18"
Al = Aluminum foil 1 mil - 6" × 16"
[1]Constricts 0.79.

EXAMPLE 7

This example demonstrates the exposing to a dc field intensity of an array of films of one uniaxial PVDF film positioned next to two layers of PVC films by stretching the films around the face of an aluminum cylinder or drum. The drum served as an anode and the array was covered by a 34 mil thick conductive rubber or 1 mil thick aluminum foil which served as the cathode.

The drum was an open ended cylinder 6 inches in diameter and 10 inches long made of 0.0625 inches thick aluminum. It was supported by attached legs with its length in a horizontal plane. The array of films with flexible contact was tightly spread almost completely around the circumference of the drum. Each end was held against the drum by clamps which also served as electrical contacts. The clamps were constructed from a 12 inch longitudinal section of one inch D copper pipe with electrical tape over each end to prevent arcing between the contact and drum. Each copper contact outside the cylinder had a matching non-conductive member placed inside the cylinder. The latter was similar to the copper member but was made from PVDF pipe. Bolts through the ends of the copper and PVDF members allowed them to be tightened against the drum. The array of films served as an insulator to prevent a short circuit between the drum and flexible rubber contact.

The uniaxial PVDF film was positioned nearest to the drum, and, in two of the subject runs, contacted the drum directly. In a third run, a piece of conductive rubber was placed between the drum and the PVDF with no independent electrical connection.

Devices for tensioning the flexible contact and array against the drum were not provided in the present apparatus. To promote good contact, a layer of the uniaxial PVDF film was also stretched around the drum as an outside cover over the flexible contact. It was anticipated that this film would shrink when heated, thereby compressing the flexible contact and array against the drum. It was not initially proposed that this film would be a candidate for poling, although it was found to acquire a small degree of piezoelectric activity.

The standard exposing procedure was used except that the final cooling under the applied field intensity was for 45 minutes to a temperature of less than 60° C. The results of the exposure are set forth in the following TABLE 7. The piezoelectric activity of the films was determined at sites located equidistance across a 16 inch TABLE 7 shows that mild wrinkling occurred in the exposings made without conductive rubber between the PVDF film and the drum (Nos. 1 and 2). The conductive rubber cathodes (No. 1) produce higher piezoelectric activity than the aluminum cathodes (No. 2). The aluminum foil constricted in this run in the manner already described in Example 4.

No wrinkling occurred over the majority of the film when conductive rubber was inserted between the drum and the array, in addition to its use as the cathode (No. 3). The wrinkling which did occur was within 3 inches of each end of the film around where it had been fastened against the drum. In this run, only one end had been clamped tightly while the other end had been fastened down with electrical tape to moderate the tension and resultant wrinkling which was thought to stem from tight clamping. Although the decreased tension appeared to assist in reducing wrinkling, it also seemed to cause lower piezoelectric activity. The values for the unwrinkled film (No. 3) were less than those for the other run employing conductive rubber (No. 1), but still superior to the values from use of the aluminum cathode (No. 2). Thus, it has been demonstrated that drum poling can be effectively accomplished with respect to activity and freedom from wrinkling by use of conductive rubber.

What is claimed is:

1. A process for treating oriented PES film for producing wrinkle-free piezoelectric film comprising applying a high strength dc field to a single or multi-layer of film, at least one layer of which is an oriented PES film, sandwiched between and in contact with resilient conductive rubber liners, at a temperature range of from about room temperature to a temperature just below the melting point of the film, the single or multi-layer with liners being disposed between a single set of oppositely charged electrodes with the liners in contact with the electrodes, and maintaining the dc field until a piezoelectric activity of at least 5 pC/N is induced in at least one of the PES oriented films, said liners being able to move freely with the film as the film is being exposed to the high strength dc field, and thereafter cooling the multi-layer to below about 50° C. before or after removing the dc field, removing the dc field and thereafter grounding the oriented PES film to remove surface charge.

2. The process of claim 1 wherein at least one PES film is uniaxially or biaxially oriented.

3. The process of claim 1 wherein the resilient conductive rubber liners are composed of a carbon containing silicone rubber sheet.

4. The process of claim 1 wherein at least one PES film has a thickness below about 150 μm.

5. The process of claim 1 wherein at least one PES film is formed from a high molecular weight vinylidene fluoride polymer.

6. The process of claim 5 wherein the high molecular weight vinylidene fluoride polymer is a homopolymer.

7. The process of claim 5 wherein the high molecular weight vinylidene fluoride polymer is a copolymer of from about 65 to about 75 weight percent of vinylidene fluoride and from about 35 to about 25 weight percent of tetrafluoroethylene.

8. The process of claim 1 wherein the multi-layer is comprised of three homogeneous layers of uniaxially oriented PES film.

9. The process of claim 1 wherein the multi-layer is comprised of a uniaxially oriented film positioned adjacent to at least one biaxially oriented film.

10. The process of claim 1 wherein the multi-layer to which the high strength dc field is applied is at a temperature in the range of from about 80° to about 110° C.

11. The process of claim 1 wherein the high strength dc field applied across the electrodes is from about 300 to about 1000 kilovolts per centimeter of thickness of the multi-layer.

12. The process of claim 11 wherein the field applied across the electrodes is gradually increased until the desired field strength is reached.

13. The process of claim 1 wherein the single or multi-layer of film is exposed to dc field at selectively limited sized boundaries within the greater film area by using small pads of one of the resilient conductive rubber liners to define the areas to be exposed by situating the pads in specific locations adjacent to an electrode.

14. The process of claim 1 wherein the single or multi-layer is exposed to the dc field by rolling continuous lengths of film and liners around a core with the core being one of the electrodes.

15. The process of claim 14 wherein the multi-layer is comprised of at least one back up layer of PVC film.

* * * * *